United States Patent
Khoury

(10) Patent No.: US 10,230,555 B2
(45) Date of Patent: *Mar. 12, 2019

(54) APPARATUS AND METHODS FOR DC BIAS TO IMPROVE LINEARITY IN SIGNAL PROCESSING CIRCUITS

(71) Applicant: Skyworks Solutions, Inc., Woburn, MA (US)

(72) Inventor: George Khoury, Ottawa (CA)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/072,746

(22) Filed: Mar. 17, 2016

(65) Prior Publication Data

US 2016/0197746 A1 Jul. 7, 2016

Related U.S. Application Data

(63) Continuation of application No. 13/627,802, filed on Sep. 26, 2012, now Pat. No. 9,325,535.

(Continued)

(51) Int. Cl.
*H03F 1/32* (2006.01)
*H03F 3/24* (2006.01)
(Continued)

(52) U.S. Cl.
CPC ............... *H04L 25/06* (2013.01); *H03F 1/32* (2013.01); *H03F 3/191* (2013.01); *H03F 3/245* (2013.01); *H04B 1/0475* (2013.01); *H04L 25/0284* (2013.01); *H03F 2200/18* (2013.01); *H03F 2200/294* (2013.01)

(58) Field of Classification Search
CPC ... H04L 25/0284; H04L 25/06; H04B 1/0475; H03F 3/211; H03F 1/0277; H03F 3/72; H03F 1/0216; H03F 2203/45481; H03F 3/19; H03F 1/0261; H03G 3/3068; H03G 1/0088

See application file for complete search history.

(56) References Cited

U.S. PATENT DOCUMENTS 5,724,005 A * 3/1998 Chen ................... H03F 1/0261
                                                                330/279
5,872,481 A * 2/1999 Sevic .................. H03F 1/0277
                                                                330/124 R (Continued)

OTHER PUBLICATIONS

Razavi, "Challenges in Portable RF Transceiver Design," 1996.
Tran, et al., "Ultra-low power series input resonance differential common gate LNA," Jun. 2011.

*Primary Examiner* — Jianxun Yang
(74) *Attorney, Agent, or Firm* — Knobbe, Martens, Olson & Bear, LLP

(57) ABSTRACT

To maintain linear operation of a signal processing circuit, such as a low noise amplifier, a peak detector detects a peak of a signal associated with the signal processing circuit and compares the detected peak signal with a threshold. When the detected peak signal is greater than the threshold, a variable current source biases the signal processing circuit to place the signal processing circuit in a different mode of operation. The signal processing circuit may thereby process a larger input signal while operating in an acceptable linear region.

17 Claims, 8 Drawing Sheets

Related U.S. Application Data

(60) Provisional application No. 61/539,878, filed on Sep. 27, 2011.

(51) Int. Cl.
   *H04B 1/04* (2006.01)
   *H03F 3/191* (2006.01)
   *H04L 25/02* (2006.01)
   *H04L 25/06* (2006.01)

(56) References Cited

U.S. PATENT DOCUMENTS

| | | | |
|---|---|---|---|
| 6,137,355 A * | 10/2000 | Sevic | H03F 1/0216 330/124 R |
| 6,175,279 B1 | 1/2001 | Ciccarelli et al. | |
| 6,242,983 B1 | 6/2001 | Shiao | |
| 2003/0197560 A1 | 10/2003 | Cheah et al. | |
| 2004/0095193 A1 | 5/2004 | Krvavac | |
| 2004/0176056 A1 | 9/2004 | Shen | |
| 2007/0252646 A1* | 11/2007 | Leung | H03F 1/0266 330/136 |
| 2010/0182090 A1* | 7/2010 | Yang | H03F 1/3205 330/277 |
| 2010/0271136 A1 | 10/2010 | Zhang et al. | |
| 2012/0013389 A1 | 1/2012 | Thomas et al. | |
| 2013/0078928 A1 | 3/2013 | Khoury | |
| 2013/0078929 A1 | 3/2013 | Khoury | |

\* cited by examiner

APPARATUS AND METHODS FOR DC BIAS TO IMPROVE LINEARITY IN SIGNAL PROCESSING CIRCUITS

INCORPORATION BY REFERENCE TO ANY PRIORITY APPLICATIONS

The present application claims priority benefit under 35 U.S.C. § 119(e) from U.S. Provisional Application No. 61/539,878, filed Sep. 27, 2011, titled "APPARATUS AND METHODS FOR DC BIAS FOR LINEARITY IMPROVEMENT IN SIGNAL PROCESSING CIRCUITS," which is hereby incorporated herein by reference in its entirety to be considered a part of this specification. Any and all applications for which a foreign or domestic priority claim is identified in the Application Data Sheet as filed with the present application are hereby incorporated by reference under 37 CFR 1.57.

BACKGROUND

Field of the Invention

The present invention is generally in the field of semiconductors, and more particularly, to dynamically adjusting biasing for signal processing circuits.

Background

Portable communication devices, such as cellular telephones, for example, use signal processing circuits to process weak signals. Signal processing circuits, such as low noise amplifiers, for example, are used to amplify weak signals, such as a signal captured by an antenna. As such, low noise amplifiers are often placed in the front end of a receiver circuit in a portable communication device. When using a low noise amplifier, the effect of noise in the receive chain is reduced by the gain of the low noise amplifier, while the noise of the low noise amplifier itself is injected into the receive signal. Thus, the low noise amplifier optimally boosts the signal power while adding as little noise and distortion as possible.

Low noise amplifiers and other signal processing circuits are often implemented in one or more stages of transistors and other related circuitry. In most applications, the operating point of the transistor is set by providing a bias current or voltage to one of the terminals of the transistor. A good low noise amplifier has a very low noise figure and is biased with a low quiescent current. In linear amplifiers, an input signal gives a larger output signal which varies in proportion to the input signal about the bias point without any change in shape. However, because a transistor is a nonlinear device, the transistor amplifier only approximates a linear device. For low distortion, the transistor is biased so that the output signal swing does not drive the transistor into a region of extreme nonlinear operation.

A constant bias current applied to the low noise amplifier can bias the amplifier to operate with a low noise figure and low quiescent current and good linearity when no signal or small signals are present at the input of the amplifier. However, when a large input signal is present, the amplifier can be driven out of the linear mode. This results in greater noise and distortion to the information signal. Radio Frequency (RF) feedback in the RF path can be used to improve the linearity of the amplifier, but this negatively impacts the noise figure and the gain.

SUMMARY

Systems and methods to sense the output signal of a signal processing circuit, such as a low noise amplifier, and to dynamically change the biasing current are disclosed. A peak detector that uses a low quiescent current, such as approximately 100 µA, for example, monitors the output signal swing. In other embodiments, the peak detector monitors an input signal, an intermediate signal in the low noise amplifier circuit, or the like. Once the monitored signal is greater than a threshold, feedback is applied to the bias circuit of the amplifier to dynamically increase the collector current. The current from a variable current source increases gradually as needed to accommodate the input signal and keep the amplifier operation in an acceptable linear region. The higher current density permits the amplifier to amplify a larger input signal swing prior to operating in an undesirable nonlinear region. This results in low quiescent current and low noise figure when no or small input signals are present as well as good linearity performance when large input signal are present.

In further disclosed systems and methods, a peak detector that uses a low quiescent current monitors the output signal, the input signal, the intermediate signal of a signal processing circuit, such as a low noise amplifier or the like. When the signal is greater than the threshold, the peak detector switches a fixed current source into the amplifier circuit to increase the biasing current to the amplifier. This also results in low quiescent current and low noise figure when no or small input signals are present as well as good linearity performance when large input signal are present.

In yet further disclosed systems and methods, more than one current source can be added to further permit the amplifier to handle a greater input signal and still maintain an acceptable linear operation. These additional current sources can be controlled by a peak detector which switches the additional biasing current from a fixed current source into the amplifier feedback circuit, in one embodiment. In another embodiment, the additional current sources can be controlled by a peak detector which gradually adds additional biasing current from a variable current source to the amplifier feedback circuit as the input signal increases. In yet other embodiments, the additional current sources can be a mixture of variable and fixed current sources.

The disclosed DC bias system and methods for improved linearity in signal processing circuits can be implemented on one or more semiconductor die. The one or more die including the DC bias system can be incorporated into a signal processing module, and the signal processing module can be incorporated into a product, such as a communication device.

Certain embodiments relate to a circuit assembly comprising a signal processing circuit for processing an input signal, a peak detector electrically connected to the signal processing circuit where the peak detector is implemented to detect a peak in a signal associated with the signal processing circuit, and a variable current source electrically connected to the peak detector and the signal processing circuit. The variable current source is implemented to bias the signal processing circuit to place the signal processing circuit in a different mode of operation when the peak is greater than a threshold so that the signal processing circuit may thereby process a larger input signal having a desired response.

According to a number of embodiments, a circuit assembly comprises a peak detector electrically connected to a signal processing circuit. The signal processing circuit is implemented to process an input signal and the peak detector is implemented to detect a peak in a signal associated with the signal processing circuit. The circuit assembly further comprises a variable current source electrically connected to the peak detector and the signal processing circuit. The variable current source is implemented to bias the signal processing circuit to place the signal processing circuit in a different mode of operation when the peak is greater than a threshold so that the signal processing circuit may thereby process a larger input signal having a desired response.

In accordance with various embodiments, a method of biasing a signal processing circuit for linearity improvement comprises receiving a radio frequency (RF) input signal for processing in a signal processing circuit, detecting a peak in a signal associated with the signal processing circuit, comparing the detected peak with a threshold, and increasing a variable current from a variable current source which provides the variable current to the signal processing circuit when the detected peak is greater than the threshold. The variable current biases the signal processing circuit to place the signal processing circuit in a different mode of operation when the peak is greater than the threshold so that the signal processing circuit may thereby process a larger RF input signal having a desired response.

Certain other embodiments relate to a multimode signal processing circuit implemented in a semiconductor die. The multimode signal processing circuit comprises a signal processing circuit for processing an input signal, a peak detector electrically connected to the signal processing circuit where the peak detector is implemented to detect a peak in a signal associated with the signal processing circuit, and a variable current source electrically connected to the peak detector and the signal processing circuit. The variable current source is implemented to bias the signal processing circuit to place the signal processing circuit in a different mode of operation when the peak is greater than a threshold so that the signal processing circuit may thereby process a larger input signal having a desired response.

According to a number of other embodiments, a bias controller is implemented in a semiconductor die and comprises a peak detector implemented to detect a peak in a signal associated with a signal processing circuit, and a variable current source electrically connected to the peak detector. The variable current source is implemented to provide a bias current to the signal processing circuit to place the signal processing circuit in a different mode of operation when the peak is greater than a threshold so that the signal processing circuit may thereby process a larger input signal having a desired response.

In accordance with various other embodiments, a multimode signal processing module comprises a multimode signal processing circuit implemented in a first semiconductor die. The multimode signal processing circuit includes a signal processing circuit for processing an input signal, a peak detector electrically connected to the signal processing circuit, and a variable current source electrically connected to the peak detector and the signal processing circuit. The peak detector is implemented to detect a peak in a signal associated with the signal processing circuit. The variable current source is implemented to bias the signal processing circuit to place the signal processing circuit in a different mode of operation when the peak is greater than a threshold so that the signal processing circuit may thereby process a larger input signal having a desired response. The multimode signal processing module further comprises at least one of a prefilter circuit, a post filter circuit, a power amplifier circuit, a switch circuit, a down converter circuit and a modulator circuit implemented in a second semiconductor die.

Certain further embodiments relate to a bias module comprising a signal processing circuit implemented in a first semiconductor die. The signal processing circuit processes an input signal. The bias module further comprises a bias controller implemented in a second semiconductor die. The bias controller includes a peak detector implemented to detect a peak in a signal associated with the signal processing circuit and a variable current source electrically connected to the peak detector. The variable current source is implemented to provide a bias current to the signal processing circuit to place the signal processing circuit in a different mode of operation when the peak is greater than a threshold so that the signal processing circuit may thereby process a larger input signal having a desired response. The bias controller further comprises at least one of a prefilter circuit, a post filter circuit, a power amplifier circuit, a switch circuit, a down converter circuit and a modulator circuit implemented in a third semiconductor die.

According to a number of further embodiments, a portable transceiver comprises an antenna implemented to receive a radio frequency (RF) input signal and transmit an RF output signal, a transmitter implemented to provide the antenna with the RF output signal, and a receiver implemented to amplify the received RF input signal. The receiver includes a signal processing circuit for processing an input signal based at least in part on the received RF input signal, a peak detector electrically connected to the signal processing circuit, and a variable current source electrically connected to the peak detector and the signal processing circuit. The peak detector is implemented to detect a peak in a signal associated with the signal processing circuit and the variable current source is implemented to bias the signal processing circuit to place the signal processing circuit in a different mode of operation when the peak is greater than a threshold so that the signal processing circuit may thereby process a larger input signal having a desired response.

Certain embodiments relate to a circuit assembly comprising a signal processing circuit for processing an input signal, a peak detector electrically connected to the signal processing circuit where the peak detector is implemented to detect a peak in a signal associated with the signal processing circuit, and a switch electrically connected to the peak detector. The peak detector is implemented to close the switch when the peak exceeds a threshold. The circuit assembly further comprises a fixed current source electrically connected to the signal processing circuit and the peak detector through the switch. The fixed current source is implemented to bias the signal processing circuit to place the signal processing circuit in a different mode of operation when the peak exceeds the threshold so that the signal processing circuit may thereby process a larger input signal having a desired response.

According to a number of embodiments, a circuit assembly comprises a peak detector electrically connected to a signal processing circuit where the signal processing circuit is implemented to process an input signal and the peak detector is implemented to detect a peak in a signal associated with the signal processing circuit. The circuit assembly further comprises a switch electrically connected to the peak detector. The peak detector is implemented to close the switch when the peak exceeds a threshold. The circuit assembly further comprises a fixed current source electrically connected to the signal processing circuit and the peak detector through the switch. The fixed current source is implemented to bias the signal processing circuit to place the signal processing circuit in a different mode of operation when the peak exceeds the threshold so that the signal processing circuit may thereby process a larger input signal having a desired response.

In accordance with various embodiments, a method of biasing a signal processing circuit for linearity improvement comprises receiving a radio frequency (RF) input signal for processing in a signal processing circuit, detecting a peak in a signal associated with the signal processing circuit, comparing the detected peak with a threshold, closing a switch when the detected peak is greater than the threshold, and enabling a fixed current source to provide a fixed current to the signal processing circuit through the switch when the detected peak is greater than the threshold. The fixed current biasing the signal processing circuit to place the signal processing circuit in a different mode of operation when the peak is greater than the threshold so that the signal processing circuit may thereby process a larger RF input signal having a desired response.

Certain other embodiments relate to a multimode signal processing circuit implemented in a semiconductor die. The multimode signal processing circuit comprises a signal processing circuit for processing an input signal, a peak detector electrically connected to the signal processing circuit where the peak detector is implemented to detect a peak in a signal associated with the signal processing circuit, a switch electrically connected to the peak detector where the peak detector is implemented to close the switch when the peak exceeds a threshold, and a fixed current source electrically connected to the signal processing circuit and the peak detector through the switch. The fixed current source is implemented to bias the signal processing circuit to place the signal processing circuit in a different mode of operation when the peak exceeds the threshold so that the signal processing circuit may thereby process a larger input signal having a desired response.

According to a number of other embodiments, a bias controller is implemented in a semiconductor die. The bias controller comprises a peak detector electrically connected to a signal processing circuit where the signal processing circuit is implemented to process an input signal and the peak detector is implemented to detect a peak in a signal associated with the signal processing circuit. The bias controller further comprises a switch electrically connected to the peak detector where the peak detector is implemented to close the switch when the peak exceeds a threshold, and a fixed current source electrically connected to the signal processing circuit and the peak detector through the switch. The fixed current source is implemented to bias the signal processing circuit to place the signal processing circuit in a different mode of operation when the peak exceeds the threshold so that the signal processing circuit may thereby process a larger input signal having a desired response.

In accordance with various other embodiments, a multimode signal processing module comprises a multimode signal processing circuit implemented in a first semiconductor die. The multimode signal processing circuit includes a signal processing circuit for processing an input signal, a peak detector electrically connected to the signal processing circuit, a switch electrically connected to the peak detector, and a fixed current source electrically connected to the signal processing circuit and the peak detector through the switch. The peak detector is implemented to detect a peak in a signal associated with the signal processing circuit and to close the switch when the peak exceeds a threshold. The fixed current source is implemented to bias the signal processing circuit to place the signal processing circuit in a different mode of operation when the peak exceeds the threshold so that the signal processing circuit may thereby process a larger input signal having a desired response. The multimode signal processing circuit further comprises at least one of a prefilter circuit, a post filter circuit, a power amplifier circuit, a switch circuit, a down converter circuit and a modulator circuit implemented in a second semiconductor die.

Certain further embodiments relate to a bias module comprising a signal processing circuit implemented in a first semiconductor die. The signal processing circuit processing an input signal. The bias module further comprises a bias controller implemented in a second semiconductor die. The bias controller includes a peak detector implemented to detect a peak in a signal associated with the signal processing circuit, a switch electrically connected to the peak detector, and a fixed current source electrically connected to the signal processing circuit and the peak detector through the switch. The peak detector is implemented to close the switch when the peak exceeds a threshold. The fixed current source is implemented to bias the signal processing circuit to place the signal processing circuit in a different mode of operation when the peak exceeds the threshold so that the signal processing circuit may thereby process a larger input signal having a desired response. The bias module further comprises at least one of a prefilter circuit, a post filter circuit, a power amplifier circuit, a switch circuit, a down converter circuit and a modulator circuit implemented in a third semiconductor die.

According to a number of further embodiments, a portable transceiver comprises an antenna implemented to receive a radio frequency (RF) input signal and transmit an RF output signal, a transmitter implemented to provide the antenna with the RF output signal, and a receiver implemented to amplify the received RF input signal. The receiver includes a signal processing circuit for processing an input signal based at least in part on the received RF input signal, a peak detector electrically connected to the signal processing circuit, a switch electrically connected to the peak detector, and a fixed current source electrically connected to the signal processing circuit and the peak detector through the switch. The peak detector is implemented to detect a peak in a signal associated with the signal processing circuit and to close the switch when the peak exceeds a threshold. The fixed current source is implemented to bias the signal processing circuit to place the signal processing circuit in a different mode of operation when the peak exceeds the threshold so that the signal processing circuit may thereby process a larger input signal having a desired response.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION

The features of the systems and methods will now be described with reference to the drawings summarized above. Throughout the drawings, reference numbers are re-used to indicate correspondence between referenced elements. The drawings, associated descriptions, and specific implementation are provided to illustrate embodiments of the inventions and not to limit the scope of the disclosure.

Figure 1A:
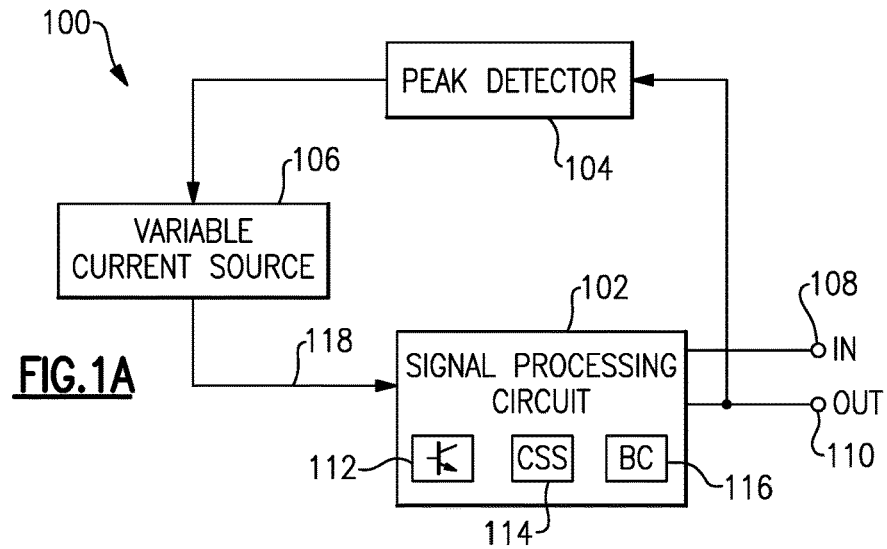
FIG. 1A is an exemplary block diagram of a DC bias circuit for linearity improvement in a signal processing circuit, according to a first embodiment.

FIG. 1A is an exemplary block diagram 100 of a DC bias circuit for linearity improvement in a signal processing circuit 102, according to one embodiment. The signal processing circuit 102 receives an input signal 108 to be processed and transmits a processed output signal 110.

In one embodiment, the signal processing circuit 102 is a low noise amplifier circuit, and the input signal 108 is, for example, an information signal received by an antenna of a communication device. Since the information signal received by the antenna can be very weak, or in other words, a signal with small amplitude or little signal power, the low noise amplifier amplifies the antenna input signal 108 to produce an amplified output signal 110 for further processing by the communication device.

In other embodiments, the signal processing circuit 102 is a mixer, an intermediate frequency (IF) amplifier, a variable gain amplifier, or the like.

The signal processing circuit 102 typically includes transistors 112, a constant current source (CCS) 114, and a biasing circuit (BC) 116, as would be known to one of skill in the art in view of the disclosure herein. The constant current source 114 provides a constant current signal to the biasing circuit 116. The biasing circuit 116 biases the transistors 112 to set the operating point of the signal processing circuit 102. The operating point is often set to approximate a processed output signal 110 with a linear response. For low distortion, the signal processing circuit 102 is biased with the constant current signal so that the output signal swing does not drive the signal processing circuit 102 into an unacceptable region of nonlinear operation when receiving small input signals 108. However, when the signal processing circuit 102 receives large input signals 108, the signal processing circuit 102 can be driven out of the linear region. The constant current signal from the constant current source 114 may be insufficient to maintain the signal processing circuit 102 in the linear region for larger input signals 108.

To prevent or reduce the occurrence of the nonlinear response by the signal processing circuit 102, a DC bias circuit 100 dynamically provides additional biasing current to the signal processing circuit 102 for larger input signals 108. In an embodiment, the DC bias circuit 100 comprises a peak detector 104 and a variable current source 106.

The processed output signal 110 of the signal processing circuit 102 electrically connects to an input of the peak detector 104 to create a feedback loop for the DC biasing circuit. An output of the peak detector 104 electrically connects to an input of the variable current source 106 and an output of the variable current source 106 electrically connects to a biasing input 118 of the signal processing circuit 102.

The peak detector 104 monitors the output signal swing from the processed output signal 110 of the signal processing circuit 102. In an embodiment, the peak detector 104 uses a low quiescent current, such that the low quiescent current of the peak detector 104 does not significantly increase the quiescent current of the overall signal processing block. In an embodiment, the peak detector 104 uses a quiescent current of approximately 100 µA. In another embodiment, the peak detector 104 uses a quiescent current of less than approximately 100 µA, and in a further embodiment, the peak detector 104 uses a quiescent current of more than approximately 100 µA. Preferably, the peak detector 104 uses a quiescent current that is less than 10% of the overall current of the signal processing block.

Once the monitored signal, which in the embodiment illustrated in FIG. 1A is the processed output signal 110, is greater than a threshold, the variable current source 106 provides additional biasing current to the signal processing circuit 102. In an embodiment, once the monitored signal 110 is greater than the threshold, the current signal from the variable current source 106 increases gradually as the monitored signal 110 increases to accommodate the larger input signal 108 and to maintain the signal processing circuit 102 in an acceptable linear region.

In an embodiment, the peak detector 104 compares the monitored signal 110 to the threshold, and when the monitored signal 110 is greater than the threshold, the peak detector 104 provides to the variable current source 106 an input signal which increases or decreases approximately in proportion to the monitored signal 110. In other words, when the monitored signal 110 is greater than the threshold, the peak detector output signal follows the monitored signal 110 such that when the monitored signal 110 increases, the peak detector output signal increases and when the monitored signal 110 decreases, the peak detector output decreases.

The threshold is based at least in part on the monitored signal. In an embodiment, the peak detector 104 compares the peak of the monitored signal 110 to the threshold. In another embodiment, the peak detector 104 compares the average value of the monitored signal 110 to the threshold. In yet another embodiment, the peak detector 104 compares the RMS value of the monitored signal 110 to the threshold. Examples of the characteristics of the monitored signal that can be used at least in part to set the thresholds are amplitude, signal level, received signal level, signal power, field strength, power level in dBm, dBw, dB, dBu and the like. In another embodiment, the peak detector 104 compares the monitored signal 110 to the threshold, and when the monitored signal 110 is greater than or equal to the threshold, the peak detector 104 provides to the variable current source 106 an input signal which increases or decreases approximately in proportion to the monitored signal 110.

The variable current source 106 receives the output of the peak detector 104 and generates a variable current signal in approximate proportion to the output signal of the peak detector 104. Thus, when the monitored signal 110 is greater than the threshold, as the monitored signal 110 increases, the variable current signal from the variable current source 106 increases and as the monitored signal 110 decreases, the variable current signal from the variable current source 106 decreases. The signal processing circuit 102 receives the variable current signal from the variable current source 106 at the biasing input 118.

In an embodiment, the variable current signal from the variable current source 106 is added to the constant current signal from the constant current source 114 of the signal processing circuit 102 and the combined or enhanced current signal is applied to the biasing circuit 116 of the signal processing circuit 102. In another embodiment, biasing circuit 116 of the signal processing circuit 102 receives the variable current signal from the variable current source 106 and does not receive the constant current signal from the fixed current source 114 when the monitored signal 110 is greater than the threshold.

The biasing circuit 116 uses the constant current from the constant current source 114 and the variable current signal from the variable current source 106 to bias the transistors 112 which sets the operating point of the signal processing circuit 102 to accommodate the input signal 108 when the monitored signal 110 is greater than the threshold. In another embodiment, the biasing circuit 116 uses the variable current signal to set the operating point of the signal processing circuit 102.

In the above embodiment, the monitored signal is the processed output signal 110 of the signal processing circuit 102. In other embodiments, the monitored signal can be the input signal 108 to be processed by the signal processing circuit 102, an intermediate signal present in the signal processing circuit, or the like.

Figure 1B:
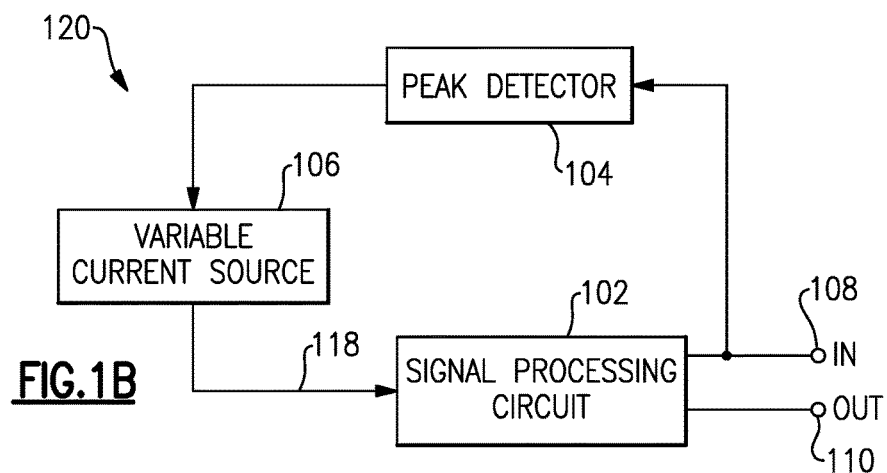
FIG. 1B is an exemplary block diagram of a DC bias circuit for linearity improvement in a signal processing circuit, according to a second embodiment.

FIG. 1B is an exemplary block diagram 120 of the DC bias circuit comprising the peak detector 104 and the variable current source 106 for linearity improvement in the signal processing circuit 102, according to a second embodiment where the monitored signal comprises the input signal 108.

In the second embodiment, the input signal 108 to be processed by the signal processing circuit 102 electrically connects to the input of the peak detector 104 to create the feedback loop for the DC biasing circuit 120. The output of the peak detector 104 electrically connects to the input of the variable current source 106 and the output of the variable current source 106 electrically connects to the biasing input 118 of the signal processing circuit 102. The signal processing circuit 102, the peak detector 104, and the variable current source 106 operate as described above.

Thus, once the monitored signal, which in the embodiment illustrated in FIG. 1B is the input signal 108 to be processed by the signal processing circuit 102, is greater than the threshold, the variable current source 106 provides additional biasing current to the signal processing circuit 102. In an embodiment, the current from the variable current source 106 increases gradually once the monitored signal 108 is greater than the threshold to accommodate the larger input signal 108 and keep the signal processing circuit 102 in an acceptable linear region. In other words, when the monitored signal 108 is greater than the threshold, as the monitored signal 108 increases, the variable current signal from the variable current source 106 increases and as the monitored signal 108 decreases, the variable current signal from the variable current source 106 decreases to accommodate the larger input signal 108 and to maintain the signal processing circuit 102 in an acceptable linear operating region.

Figure 1C:
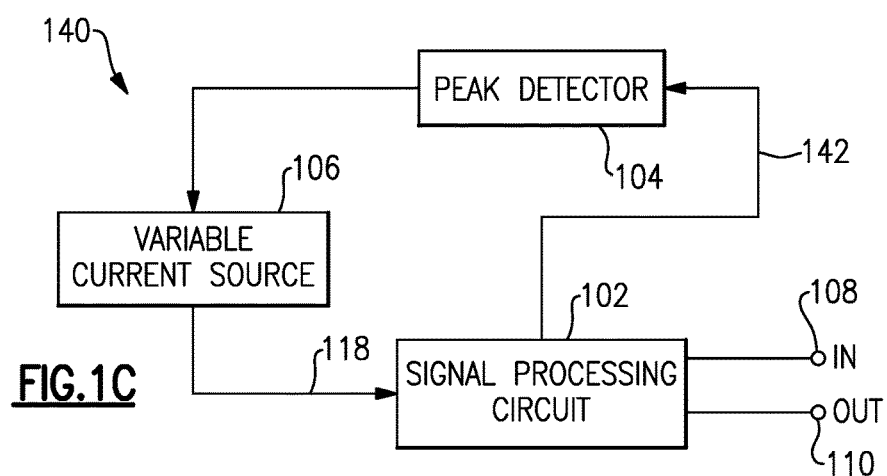
FIG. 1C is an exemplary block diagram of a DC bias circuit for linearity improvement in a signal processing circuit, according to a third embodiment.

FIG. 1C is an exemplary block diagram 140 of the DC bias circuit comprising the peak detector 104 and the variable current source 106 for linearity improvement in the signal processing circuit 102, according to a third embodiment where the monitored signal comprises an intermediate signal 142 from the signal processing circuit 102. For example, when the signal processing circuit 102 is a multi-stage amplifier circuit, the intermediate signal 142 can be, for example, a signal between the stages, and the like. In another example, when the signal processing circuit 102 is a series of signal processing blocks, such as an amplifier followed by a mixer circuit, or an amplifier followed by a filter, for example as would be known to one of skill in the art in view of the disclosure herein, the intermediate signal 142 can be the junction between the blocks.

In the third embodiment, the intermediate signal 142 of the signal processing circuit 102 electrically connects to the input of the peak detector 104 to create the feedback loop for the DC biasing circuit 140. The output of the peak detector 104 electrically connects to the input of the variable current source 106 and the output of the variable current source 106 electrically connects to the biasing input 118 of the signal processing circuit 102. The signal processing circuit 102, the peak detector 104, and the variable current source 106 operate as described above.

Thus, once the monitored signal, which in the embodiment illustrated in FIG. 1C is the intermediate signal 142 of the signal processing circuit 102, is greater than the threshold, the variable current source 106 provides additional biasing current to the signal processing circuit 102. In an embodiment, the current from the variable current source 106 increases gradually once the monitored signal 142 is greater than the threshold to accommodate the larger input signal 108 and to maintain the signal processing circuit 102 in an acceptable linear region. In other words, when the monitored signal 142 is greater than the threshold, as the monitored signal 142 increases, the variable current signal from the variable current source 106 increases and as the monitored signal 142 decreases, the variable current signal from the variable current source 106 decreases to accommodate the larger input signal 108 and to maintain the signal processing circuit 102 in an acceptable linear operating region.

Figure 2A:
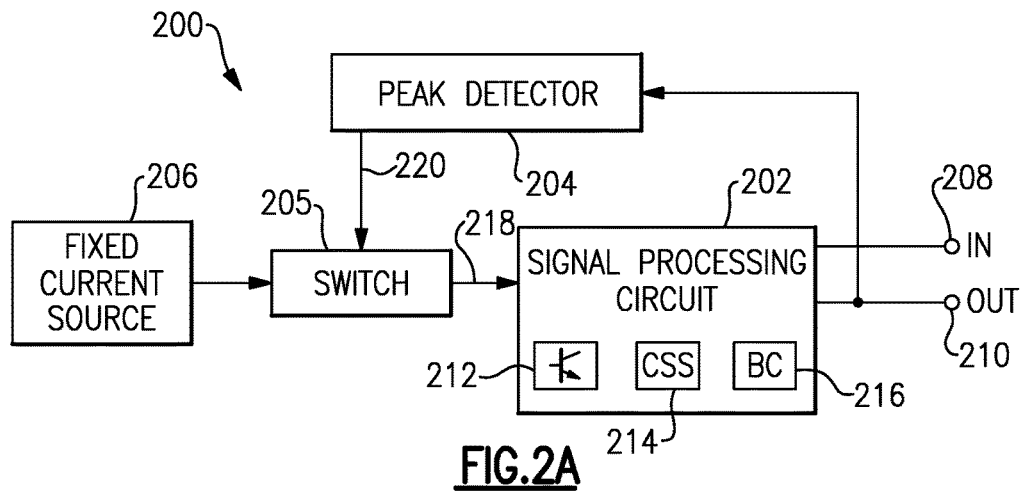
FIG. 2A is an exemplary block diagram of a DC bias circuit for linearity improvement in a signal processing circuit, according to a fourth embodiment.

FIG. 2A is an exemplary block diagram 200 of a DC bias circuit for linearity improvement in a signal processing circuit 202, according to a fourth embodiment. The signal processing circuit 202 receives an input signal 208 to be processed and transmits a processed output signal 210.

In one embodiment, the signal processing circuit 202 is a low noise amplifier circuit, and the input signal 208 is, for example, an information signal received by an antenna of a communication device. The low noise amplifier amplifies the antenna input signal 208 to produce an amplified output signal 210 for further processing by the communication device.

In other embodiments, the signal processing circuit 202 is a mixer, an intermediate frequency (IF) amplifier, a variable gain amplifier, or the like.

The signal processing circuit 202 typically includes transistors 212, a constant current source (CCS) 214, and a biasing circuit (BC) 216, as is known to one of skill in the art in view of the disclosure herein. The constant current source 214 provides a constant current signal to the biasing circuit 216. The biasing circuit 216 biases the transistors 212 to set the operating point of the signal processing circuit 202. The operating point is often set to approximate a processed output signal 210 with a linear response. For low distortion, the signal processing circuit 202 is biased with the constant current signal so that the output signal swing does not drive the signal processing circuit 202 into an unacceptable region of nonlinear operation when receiving small input signals 208. However, when the signal processing circuit receives large input signals 208, the signal processing circuit 202 can be driven out of the linear mode. The constant current signal from the constant current source 214 may be insufficient to maintain the signal processing circuit 202 in the linear region for larger input signals 208.

To prevent or reduce the occurrence of the nonlinear response by the signal processing circuit 202, a DC bias circuit switches additional biasing current into the signal processing circuit 202 for larger input signals 208. In an embodiment, the DC bias circuit comprises a peak detector 204, a switch 205, and a fixed current source 206.

The processed output signal 210 of the signal processing circuit 202 electrically connects to an input of the peak detector 204 to create a feedback loop for the DC biasing circuit 200. An output of the peak detector 204 electrically connects to a control input 220 of the switch 205 to control the opening and closing of the switch 205. A fixed current output signal of the fixed current source 206 electrically connects to a first switch terminal of the switch 205 and a second switch terminal electrically connects to a biasing input 218 of the signal processing circuit 202 such that when the switch 205 is closed, the fixed current output signal of the fixed current source 206 electrically connects to the biasing input 218 of the signal processing circuit 202.

The peak detector 204 monitors the output signal swing from the processed output signal 210 of the signal processing circuit 202 and uses a low quiescent current as described above with respect to the signal processing circuit 102. The fixed current source 206 outputs a fixed current signal as would be known to one of skill in the art in view of the disclosure herein. The switch 205 provides a mechanism to switch the fixed current signal from the fixed current source 206 into or out of the DC bias circuit 200. The switch 205 can be implemented using transistors, or other solid state fabrication techniques, as would be know to one of skill in the art in view of the disclosure herein.

Once the monitored signal, which in the embodiment illustrated in FIG. 2A is the processed output signal 210, is greater than a threshold, the peak detector 204 enables or closes the switch 205 to permit the biasing input 218 of the signal processing circuit 202 to receive the fixed current signal from the fixed current source 206. The fixed current source 206 provides additional biasing current to the signal processing circuit 202 to accommodate the larger input signal 208 and to maintain the signal processing circuit 202 in an acceptable linear region.

In an embodiment, the peak detector 204 compares the monitored signal 210 to the threshold, and when the monitored signal 210 is greater than the threshold, the peak detector 204 enables or closes the switch 205, which provides the fixed current signal to the signal processing circuit 202. When the monitored signal 210 is less than the threshold, the peak detector 204 disables or opens the switch 205 such that the fixed current source 206 is electrically disconnected from the signal processing circuit 202.

In an embodiment, the peak detector 204 compares the peak of the monitored signal 210 to the threshold. In another embodiment, the peak detector 204 compares the average value of the monitored signal 210 to the threshold. In yet another embodiment, the peak detector 204 compares the RMS value of the monitored signal 210 to the threshold. In another embodiment, the peak detector 204 compares the monitored signal 210 to the threshold, and when the monitored signal 210 is greater than or equal to the threshold, the peak detector 204 enables or closes the switch 205, which provides the fixed current signal to the signal processing circuit 202. The signal processing circuit 202 receives the fixed current signal from the fixed current source 206 at the biasing input 218.

In an embodiment, the fixed current signal from the fixed current source 206 is added to the constant current signal from the constant current source 214 of the signal processing circuit 202 and the combined or enhanced current signal is applied to the biasing circuit 216 of the signal processing circuit 202. In another embodiment, biasing circuit 216 of the signal processing circuit 202 receives the fixed current signal from the fixed current source 206 and does not receive the constant current signal from the constant current source 214 when the monitored signal 210 is greater than the threshold.

The biasing circuit 216 uses the constant current from the constant current source 214 and the fixed current signal from the fixed current source 206 to bias the transistors 212 which sets the operating point of the signal processing circuit 202 to accommodate the larger input signal 208 when the monitored signal 210 is greater than the threshold. In another embodiment, the biasing circuit 216 uses the fixed current signal to set the operating point of the signal processing circuit 202.

In an embodiment, the output of the peak detector 204 used to control the switch 205 also enables or disables the fixed current source 205. In other embodiments, the peak detector 204 provides another output signal to enable or disable the fixed current source 206, in addition to the switch control output signal, which controls the opening or closing of the switch 205. Thus, when the monitored signal 210 is greater than the threshold, the peak detector 204 enables the fixed current source 206 and closes the switch 205 to provide the fixed current signal to the biasing input 218 of the signal processing circuit 202. When the monitored signal is less than the threshold, the peak detector 204 disables the fixed current source 206 and opens the switch 205, which prevents additional biasing current from the fixed current source to reach the signal processing circuit 202.

In the above embodiment, the monitored signal is the processed output signal 210 of the signal processing circuit 202. In other embodiments, the monitored signal can be the input signal 208 to be processed by the signal processing circuit 202, an intermediate signal present in the signal processing circuit 202, or the like.

Figure 2B:
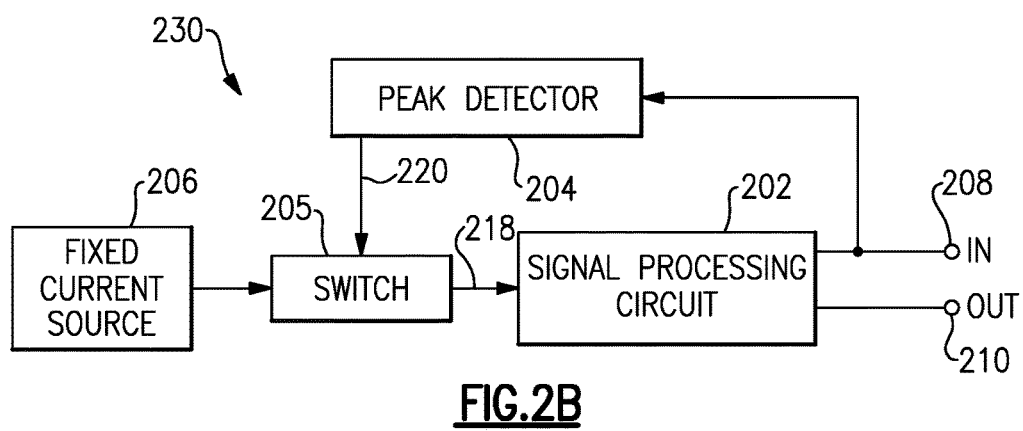
FIG. 2B is an exemplary block diagram of a DC bias circuit for linearity improvement in a signal processing circuit, according to a fifth embodiment.

FIG. 2B is an exemplary block diagram 230 of a DC bias circuit comprising the peak detector 204, the switch 205, and the fixed current source 206 for linearity improvement in the signal processing circuit 202, according to a fifth embodiment where the monitored signal comprises the input signal 208.

In the fifth embodiment, the input signal 208 to be processed by the signal processing circuit 202 electrically connects to the input of the peak detector 204 to create the feedback loop for the DC biasing circuit 230. An output of the peak detector 204 electrically connects to the control input 220 of the switch 205 to control the opening and closing of the switch 205. A fixed current output signal of the fixed current source 206 electrically connects to the first switch terminal of the switch 205 and the second switch terminal electrically connects to the biasing input 218 of the signal processing circuit 202 such that when the switch 205 is closed, the fixed current output signal from the fixed current source 206 electrically connects to the biasing input 218 of the signal processing circuit 202. The signal processing circuit 202, the peak detector 204, the switch 205, and the fixed current source 206 operate as described above.

Thus, once the monitored signal, which in the embodiment illustrated in FIG. 2B is the input signal 208 to be processed by the signal processing circuit 202, is greater than the threshold, the peak detector 204 enables or closes the switch 205 to permit the biasing input 218 of the signal processing circuit 202 to receive the fixed current signal from the fixed current source 206. The fixed current source 206 provides additional biasing current to the signal processing circuit 202 to accommodate the larger input signal 208 and to maintain the signal processing circuit 202 in an acceptable linear operating region.

Figure 2C:
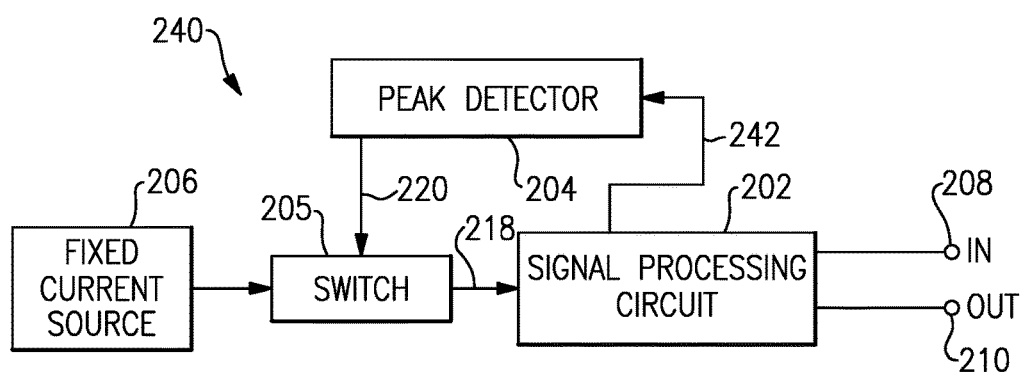
FIG. 2C is an exemplary block diagram of a DC bias circuit for linearity improvement in a signal processing circuit, according to a sixth embodiment.

FIG. 2C is an exemplary block diagram 240 of a DC bias circuit comprising the peak detector 204, the switch 205, and the fixed current source 206 for linearity improvement in a signal processing circuit 202, according to a sixth embodiment where the monitored signal comprises an intermediate signal 242 from the signal processing circuit 202. For example, when the signal processing circuit 202 is a multistage amplifier circuit, the intermediate signal 242 can be, for example, a signal between the stages, and the like. In another example, when the signal processing circuit 202 is a series of signal processing blocks, such as an amplifier followed by a mixer circuit, or an amplifier followed by a filter, for example as would be known to one of skill in the art in view of the disclosure herein, the intermediate signal 242 can be the junction between the blocks.

In the sixth embodiment, the intermediate signal 242 of the signal processing circuit 202 electrically connects to the input of the peak detector 204 to create the feedback loop for the DC biasing circuit 240. The output of the peak detector 204 electrically connects to the control input 220 of the switch 205 to control the opening and closing of the switch 205. The fixed current output signal of the fixed current source 206 electrically connects to the first switch terminal of the switch 205 and the second switch terminal electrically connects to the biasing input 218 of the signal processing circuit 202 such that when the switch 205 is closed, the fixed current output signal of the fixed current source 206 electrically connects to the biasing input 218 of the signal processing circuit 202. The signal processing circuit 202, the peak detector 204, the switch 205, and the fixed current source 206 operate as described above.

Thus, once the monitored signal, which in the embodiment illustrated in FIG. 2C is the intermediate signal 242 from the signal processing circuit 202, is greater than the threshold, the peak detector 204 enables or closes the switch 205 to permit the biasing input 218 of the signal processing circuit 202 to receive the fixed current signal from the fixed current source 206. The fixed current source 206 provides additional biasing current to the signal processing circuit 202 to accommodate the larger input signal 208 and to maintain the signal processing circuit 202 in an acceptable linear operating region.

Figure 3:
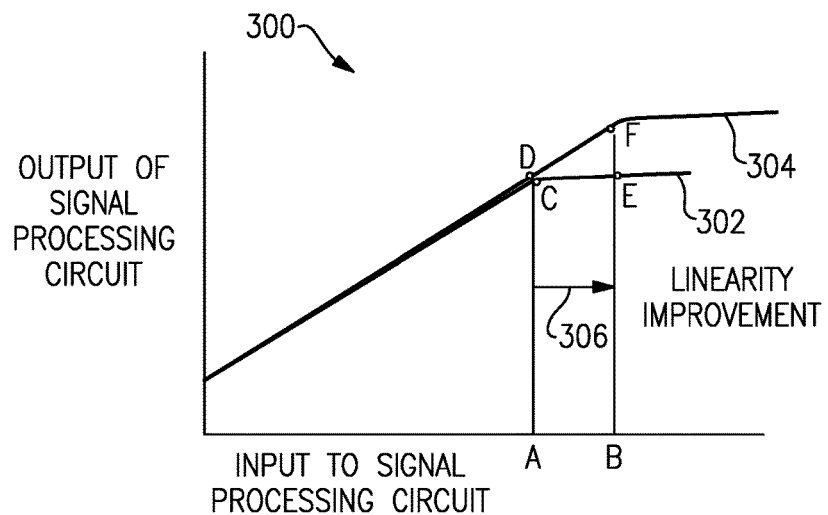
FIG. 3 is an exemplary graph of responses of exemplary signal processing circuits with and without a DC bias circuit for linearity improvement, according to certain embodiments.

FIG. 3 is an exemplary graph 300 showing the response of exemplary signal processing circuits 102, 202 with and without a DC bias circuit for linearity improvement, according to certain embodiments. The y-axis represents the processed output signal 110, 210 of the signal processing circuit 102, 202 and the x-axis represents the input signal 108, 208 to be processed by the signal processing circuit 102, 202. Trace 302 represents an exemplary response of the signal processing circuit 102, 202 without the DC bias circuit. Trace 304 represents an exemplary response of the signal processing circuit 102, 202 with the DC bias circuit for linearity improvement.

For a small input signal A, both of the exemplary responses 302, 304 fall within an acceptable linear operating range of the signal processing circuit 102, 202, as indicated by points C and D, respectively. However, for a large input signal B, the exemplary response 302 for the signal processing circuit 102, 202 without the DC biasing circuit falls outside the acceptable linear operating region, as indicated by point E, while the exemplary response 304 for the signal processing circuit 102, 202 with the DC biasing circuit is within the acceptable linear operating region, as indicated by point F. The DC biasing circuit provides a linearity improvement 306 to the amplifier having the response 304 over the amplifier having the response 302.

Figure 4A:
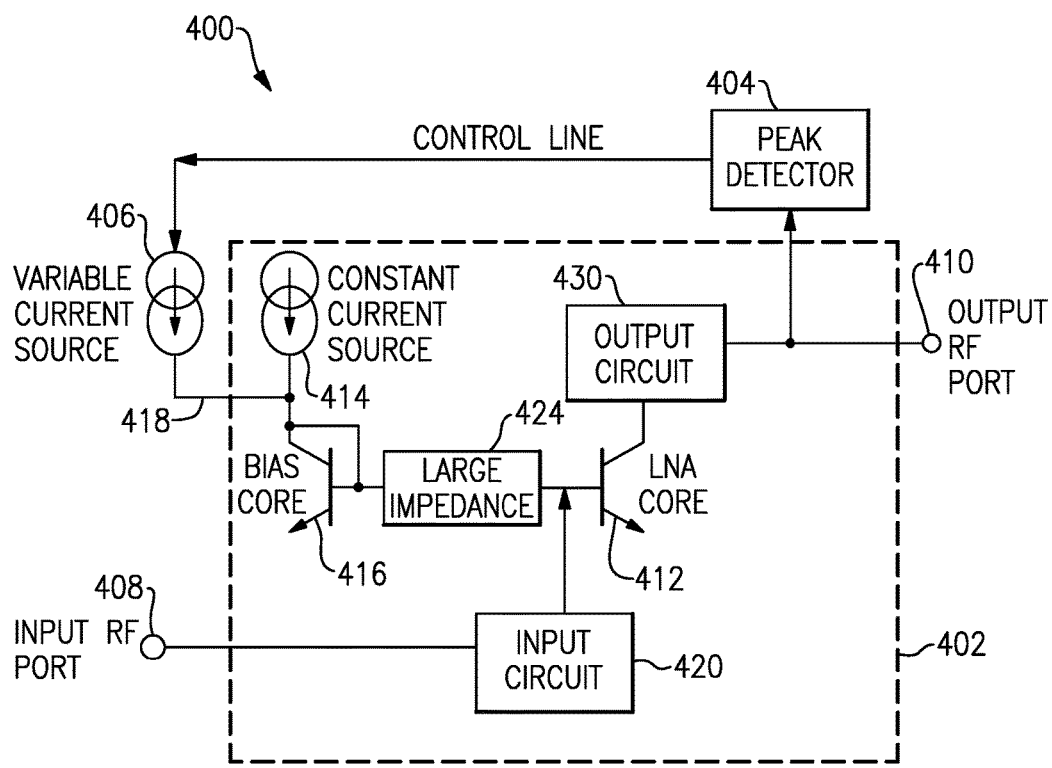
FIG. 4A is an exemplary schematic diagram of peak detector and variable current source for improving linearity in a low noise amplifier, according to certain embodiments.

FIG. 4A is an exemplary schematic diagram 400 of a peak detector 404 and a variable current source 406 for improving linearity in a low noise amplifier (LNA) 402, according to certain embodiments.

The low noise amplifier 402 comprises a Radio Frequency (RF) input port 408 for receiving an RF input signal to be amplified and an RF output port 410 for transmitting an amplified RF output signal for further processing. The low noise amplifier 402 further comprises an input circuit 420, a constant current source 414, a biasing circuit 416, large impedance 424, an LNA core 412, and an output circuit 430.

The constant current source 414 provides a constant current to the collector of the biasing circuit 416 which couples to the base of the LNA core 412 through the large impedance 424 to set an operating point for the LNA core 412 within an acceptable linear operating region for small input signals, as would be known to one of skill in the art in view of the disclosure herein. The input circuit 420 receives the RF input signal from the input RF port 408 and sends the received RF signal to the LNA core 412 for amplification as would be known to one of skill in the art in view of the disclosure herein. The amplified output signal is sent from the LNA core 412 to the output circuit 430, where it is transmitted to the output RF port 410, as would be known to one of skill in the art in view of the disclosure herein. When the input signal increases, the constant current source 414 may be insufficient to bias the LNA core 412 to set the operating point in an acceptable linear operating region, such as is indicated by the response 302 in FIG. 3.

In an embodiment, a DC biasing circuit 400 comprising the peak detector 404 and the variable current source 406 provides additional biasing current to permit the LNA 402 to operate in an acceptable linear region for large input signals, as is indicated by the response 304 in FIG. 3.

The peak detector 404 receives and monitors the amplifier output signal from the output circuit 430. In an embodiment, when the monitored signal is greater than a threshold, feedback is applied to the biasing circuit 416 of the LNA 402 to dynamically increase the collector current. The peak detector 404 enables the variable current source 406. The variable current source 406 produces a variable current which is approximately proportional to the monitored signal, such that when the monitored signal increases, the variable current signal increases and when the monitored signal decreases, the variable current signal decreases. The variable current signal and the constant current signal are combined and applied to the biasing circuit 416 through a biasing input 418 to set the operating point of the LNA 402 to accommodate larger input signals and to remain in the acceptable linear operating range.

Figure 4B:
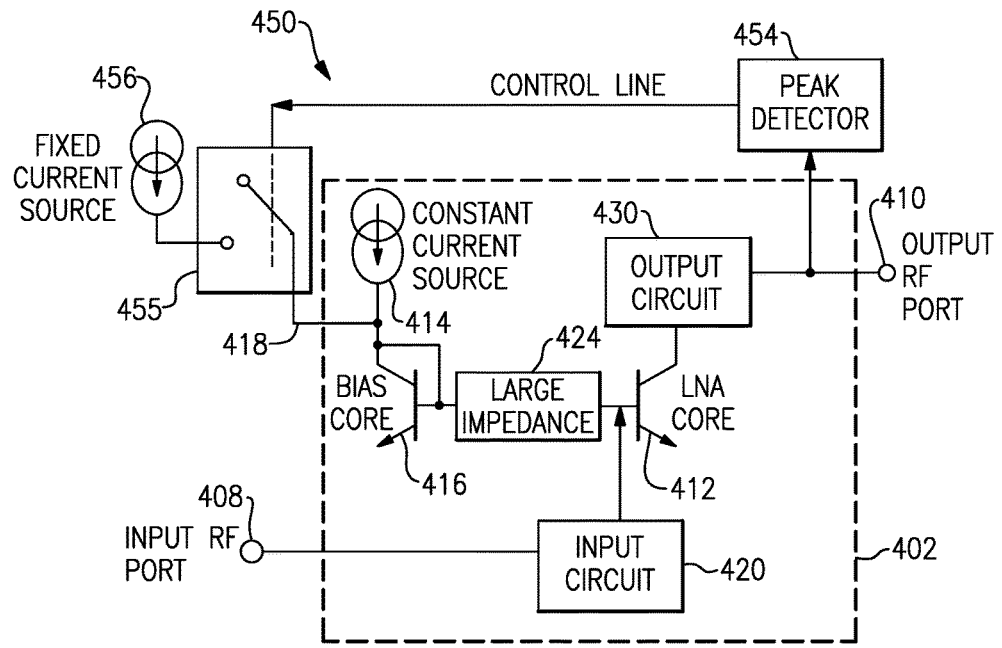
FIG. 4B is an exemplary schematic diagram of peak detector and a fixed current source for improving linearity in a low noise amplifier, according to certain embodiments.

FIG. 4B is an exemplary schematic diagram 450 of a peak detector 454, a switch 455, and a fixed current source 456 for improving linearity in the low noise amplifier (LNA) 402, according to certain embodiments. As described above, the constant current source 414 may be insufficient to bias the LNA core 412 to set the operating point in an acceptable linear operating region when the input signal increases, as is indicated by the response 302 in FIG. 3.

In an embodiment, a DC biasing circuit 450 comprising the peak detector 454, the switch 455, and the variable current source 456 provides additional biasing current to permit the LNA 402 to operate in an acceptable linear region for large input signals, as is indicated by the response 304 in FIG. 3.

The peak detector 454 receives and monitors the amplifier output signal from the output circuit 430. When the monitored signal is greater than the threshold, the peak detector 454 enables or closes the switch 455, which electrically connects the fixed current source 456 to the biasing input 418. The fixed current source 456 produces a fixed current which is received by the biasing input 418. The fixed current signal and the constant current signal are combined and applied to the biasing circuit 416 through a biasing input 418 to set the operating point of the LNA 402 to accommodate larger input signals and to remain in the acceptable linear operating range. In an embodiment, the fixed current source 456 is enabled when the monitored signal is greater than the threshold. In another embodiment, the fixed current source is enabled prior to the monitored signal exceeding the threshold but is not electrically connected to the LNA 402 until the monitored signal exceeds the threshold and the peak detector 454 enables or closed the switch 455.

Figure 5:
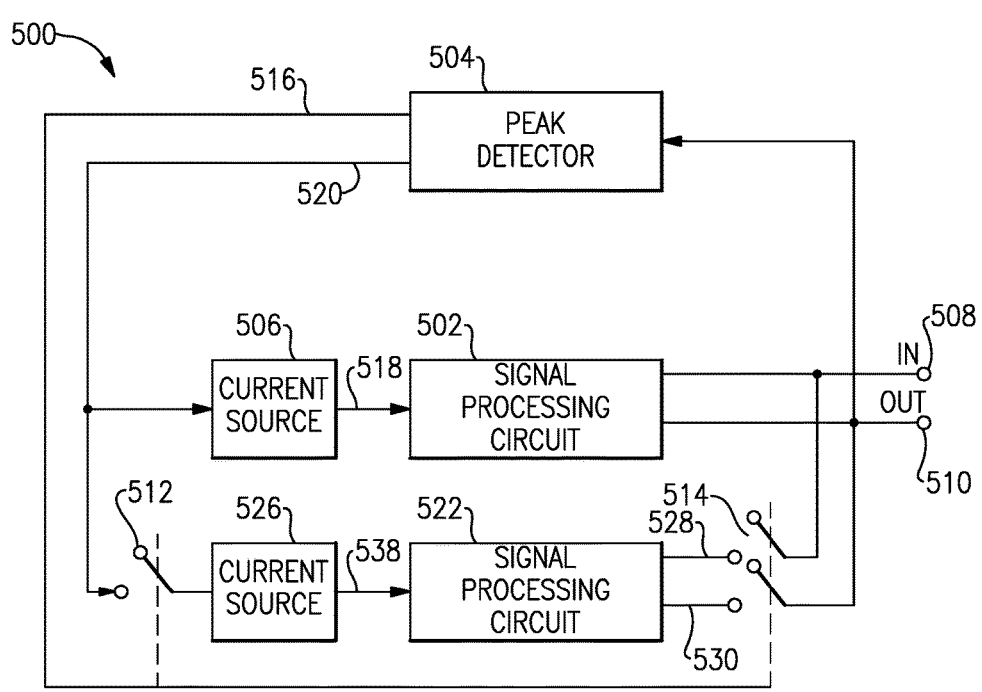
FIG. 5 is an exemplary block diagram of a peak detector and multiple current sources for improving linearity in a signal processing circuit, according to certain embodiments.

FIG. 5 is an exemplary block diagram of circuit 500 for improving linearity of a signal processing circuit 502 for yet larger input signals, according to other embodiments. The signal processing circuit 502 includes an input signal 508 to be processed by the signal processing circuit 502 and a processed output signal 510 resulting from the processing of the input signal 508. The circuit 500 further comprises a peak detector 504 and a current source 506. The peak detector 504 monitors the processed output signal 510 to determine if the monitored signal is greater than a threshold. In other embodiments, the peak detector 504 can monitor the input signal 508, an intermediate signal within the signal processing circuit 502, or the like.

A current source control signal 520 from the peak detector 502 electrically connects to an input of the current source 506. In an embodiment, the current source 506 is a variable current source and the peak detector 504 enables the variable current source 506 such that the variable current source 506 produces a variable current signal that is approximately proportional to the monitored signal 510 when the monitored signal 510 is greater than the threshold.

In another embodiment, the current source 506 is a switch electrically coupled to a fixed current source which produces a fixed current signal. The peak detector 504 enables or closes the switch in the current source 506 when the monitored signal 510 is greater than the threshold. When the switch in the current source is closed, the fixed current source 506 electrically couples to the signal processing circuit 502 through the switch. In a further embodiment, the peak detector 504 also enables the fixed current source when the monitored signal 510 is greater than the threshold.

The signal processing circuit 502 receives the current signal at a biasing input 518 which sets the operating point of the signal processing circuit 502 to accommodate the input signal 508, as described herein. For yet larger input signals 508, one or more series combinations of current sources and signal processing circuits are added in parallel to the series combination of the current source 506 and the signal processing circuit 502. The additional signal processing circuits with appropriate biasing from the additional current sources share the power of the yet larger input signal 508 with the signal processing circuit 502 to maintain the output signal 510 in an acceptable linear region.

The circuit 500 further comprises a second current source 526 and a second signal processing circuit 522 including an input signal 528 to be processed by the processing circuit 522 and a processed output signal 530. An input of the current source 526 electrically connects to the current source control output 520 of the peak detector 504 through a switch 512 and an output of the current source 526 electrically connects to a biasing input 538 of the signal processing circuit 522. The input signal 508 electrically connects to the input signal 528 through a switch 514 and the processed output signal 510 electrically connects to the processed output signal 530 through the switch 514. In other words, the series combination of the current source 526 and the signal processing circuit 522 is electrically connected in parallel with the series combination of the current source 506 and the signal processing circuit 502 when the switches 512 and 514 are closed. When the switches 512 and 514 are open, the series combination of the current source 526 and the signal processing circuit 522 is electrically disconnected from the series combination of the current source 506 and the signal processing circuit 502.

A switch control output 516 of the peak detector 504 controls the state of the switches 512 and 514 such that the peak detector 504 closes the switches 512 and 514 when the monitored signal 510 is greater than a second threshold and opens the switches 512 and 514 when the monitored signal 510 is less than the second threshold.

The thresholds are based at least in part on the monitored signal. Examples of the characteristics of the monitored signal that can be used at least in part, to set the thresholds are amplitude, signal level, received signal level, signal power, field strength, power level in dBm, dBw, dB, dBu and the like. The first threshold can be set to add additional biasing to the signal processing circuit 522 to permit the signal processing circuit 502 to operate in an acceptable linear region with larger input signals 508. The second threshold can be set to switch in the signal processing circuit 522 and current source 526 to maintain the output signal 510 in an acceptable linear region for yet larger input signals 508. In an embodiment, the second threshold is approximately greater than or equal to the first threshold. In another embodiment, the second threshold is greater than the first threshold.

In an embodiment, the current source 526 is a variable current source 106, 406 and the peak detector 504 enables the variable current source 526 such that the variable current source 526 produces a variable current signal that is approximately proportional to the monitored signal 510 when the monitored signal 510 is greater than the second threshold. The peak detector 504 also enables or closes the switches 512 and 514 when the monitored signal 510 is greater than the second threshold. The signal processing circuit 522 receives the variable current signal at the biasing input 538 which sets the operating point of the signal processing circuit 522 to accommodate the input signal 508, as described herein.

In another embodiment, each current source 506 and 526 comprises a fixed current source and a switch and operates as other fixed current sources/switches 206/205, 456/455 described herein. The peak detector 504 enables the fixed current source 526 such that the fixed current source 526 produces a fixed current signal when the monitored signal 510 is greater than the second threshold. The peak detector 504 also enables or closes the switches 512 and 514 when the monitored signal 510 is greater than the second threshold. The signal processing circuit 522 receives the fixed current signal at the biasing input 538 which sets the operating point of the signal processing circuit 522 to accommodate the input signal 508, as described herein.

The parallel combinations of current sources and signal processing circuits 506/502 and 526/522, respectively, permit the circuit 500 to accommodate the yet larger input signal 508 and to maintain the output signal 510 within an acceptable linear operating region.

In a further embodiment, one of the current sources 506 and 526 comprises the variable current source 106, 406 and the other of the current sources 506 and 526 comprises the fixed current source 206, 456 and the switch 205, 455.

In an embodiment, the switch 512 can be optionally excluded from the circuit 500 and the fixed current sources 506, 526 can be enabled by the output signal 520 from the peak detector 504 when the monitored signal 510 is greater than the threshold. In another embodiment, the switch 512 and the output signal 520 can be optionally excluded from the circuit 500, and the fixed current sources 506, 526 are always enabled. When the monitored signal 510 is greater than the threshold, the peak detector 504 through the output signal 516 closes the switch 514 to accommodate the yet larger input signal 508.

In another embodiment, the switch 514 can be optionally excluded from the circuit 500 and the input signals 508, 528 are electrically coupled and the output signals 510, 530 are electrically coupled.

In another embodiment, more than one additional series combination of a current source and a signal processing circuit can be added in parallel to the circuit 500 to accommodate an even larger input signal 508 and to maintain the output signal 510 within an acceptable linear operating range. In further embodiments, additional thresholds can be set to selectively enable additional series combinations of a current source and a signal processing circuit as needed to accommodate larger input signals 508 such that the signal processing circuit 502 maintains the output signal 510 within an acceptable linear operating range.

Figure 6:
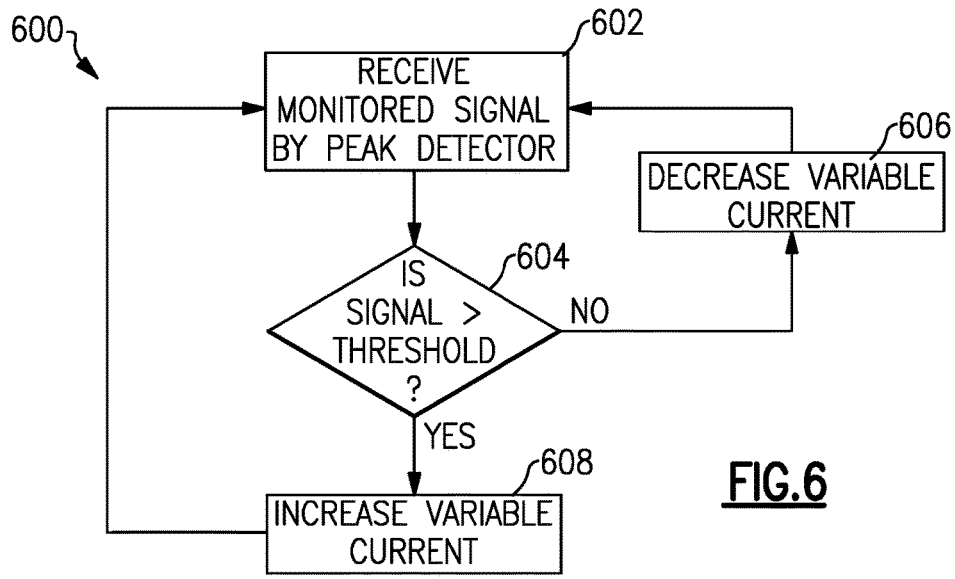
FIG. 6 is a flow chart of an exemplary process for improving the linearity of a signal processing circuit, according to certain embodiments.

FIG. 6 is a flow chart of an exemplary process 600 for improving the linearity of the signal processing circuit 102, 402, according to certain embodiments. Referring to FIGS. 1A, 1B, 1C, 4A and FIG. 6, the process 600 begins at block 602 where the peak detector 104, 404 receives the monitored signal 108, 110, 142, 410. At block 604, the peak detector 104, 404 determines whether the monitored signal 108, 110, 142, 410 is greater than a threshold.

If the monitored signal 108, 110, 142, 410 is less than the threshold, then at block 606 the process 600 decreases the variable current from the variable current source 106, 406. The process 600 then moves to block 602, where the peak detector 104, 404 receives the monitored signal 108, 110, 142, 410.

If the monitored signal 108, 110, 142, 410 is greater than the threshold, then at block 608 the process 600 increases the variable current from the variable current source 106, 406 to accommodate the input signal 108, 408. The process 600 then moves to block 602, where the peak detector 104, 404 receives the monitored signal 108, 110, 142, 410.

Figure 7:
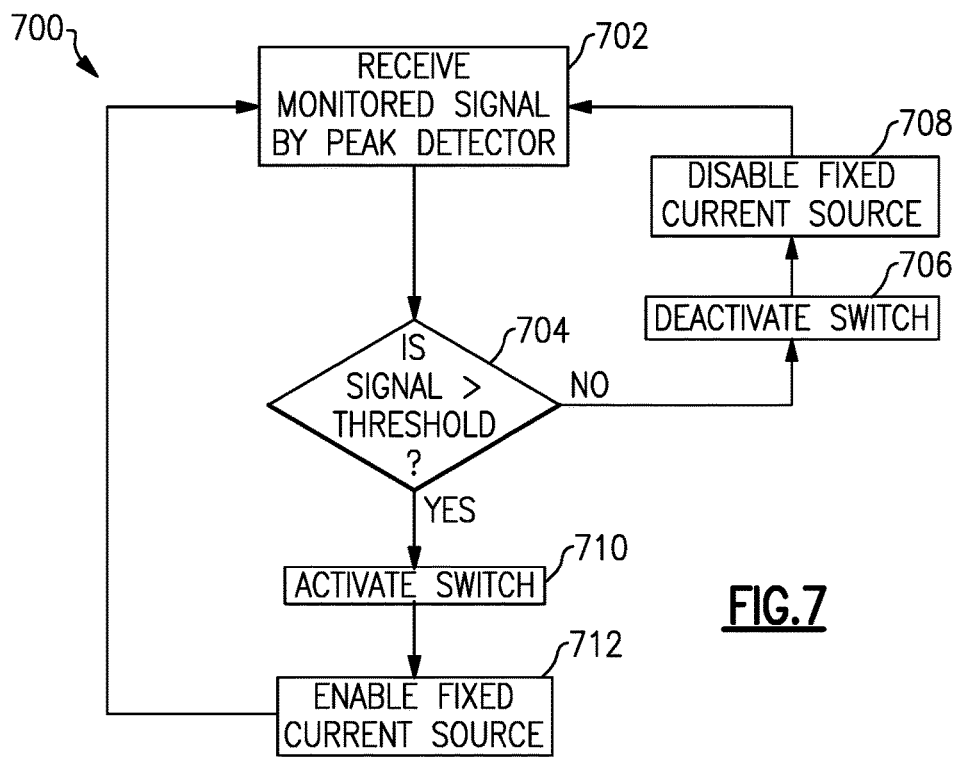
FIG. 7 is a flow chart of an exemplary process for improving the linearity of a signal processing circuit, according to certain other embodiments.

FIG. 7 is a flow chart of an exemplary process 700 for improving the linearity of the signal processing circuit 202, 402, according to certain other embodiments. Referring to FIGS. 2A, 2B, 2C, 4B, and FIG. 7, the process 700 begins at block 702 where the peak detector 204, 454 receives the monitored signal 208, 210, 242, 410. At block 704, the peak detector 204, 454 determines whether the monitored signal 208, 210, 242, 410 is greater than a threshold.

In one embodiment, such as is illustrated in FIGS. 2A, 2B, 2C, 4B, if the monitored signal 208, 210, 242, 410 is less than the threshold, then at block 706 the process 700 deactivates or opens the switch 205, 455. The process 700 then moves to block 702, where the peak detector 204, 454 receives the monitored signal 208, 210, 242, 410. If the monitored signal 208, 210, 242, 410 is greater than the threshold, then at block 710 the process 700 activates or closes the switch 205, 455. The process 700 then moves to block 702, where the peak detector 204, 454 receives the monitored signal 208, 210, 242, 410.

In another embodiment, the peak detector 204, 454 further comprises a second output electrically coupled to an input of the fixed current source 206, 456 to control the fixed current source 206, 456. As illustrated in FIG. 7, if the monitored signal 208, 210, 242, 410 is less than the threshold, then at block 706 the process 700 deactivates or opens the switch 205, 455 and at block 708 the process 700 disables the fixed current source 206, 456. If the monitored signal 208, 210, 242, 410 is greater than the threshold, then at block 710 the process 700 activates or closes the switch 205, 455, and at block 712 the process 700 enables the fixed current source 206, 456. The process 700 then moves to block 702, where the peak detector 204, 454 receives the monitored signal 208, 210, 242, 410.

Figure 8:
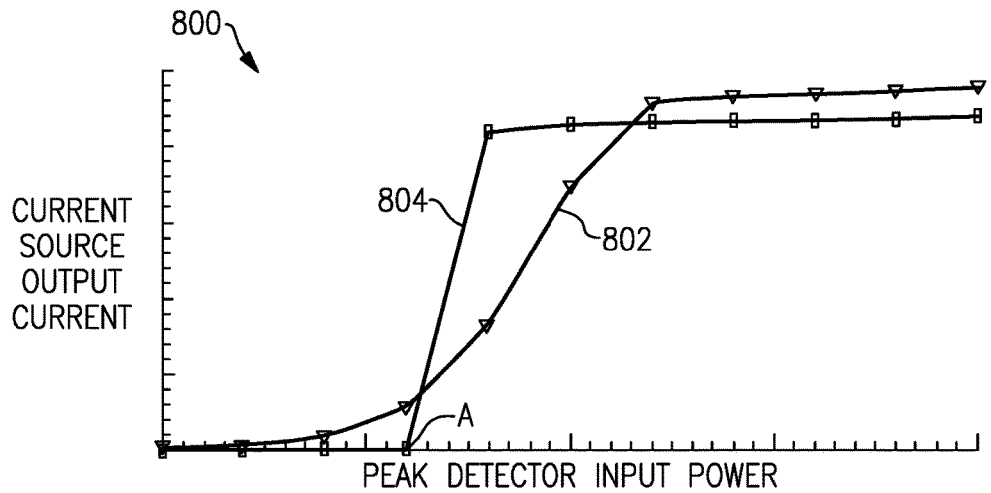
FIG. 8 is an exemplary graph of peak detector input power versus current source output current, according to certain embodiments.

FIG. 8 is an exemplary graph 800 of current source output current versus peak detector input power, according to certain embodiments. The graph 800 illustrates the different approaches to increasing the biasing current of the signal processing circuit 102, 202, 402. The x-axis represents the power of the monitored signal received by the peak detector 104, 204, 404, 454 and the y-axis represents the output current of the current source 106, 206, 406, 456. Trace 802 represents the variable current signal of the variable current source 106, 406 and trace 804 represents the fixed current signal of the fixed current source 206, 456.

Referring to FIGS. 1A, 1B, 1C, 4A and trace 802, as the power of the monitored signal 108, 110, 142, 410 received by the peak detector 104, 404 increases above a threshold indicated by point A, the variable current signal from the variable current source 106, 406 gradually increases. In contrast, referring to FIGS. 2A, 2B, 2C, 4B and trace 804, as the power of the monitored signal 208, 210, 242, 410 received by the peak detector 204, 454 reaches the threshold A, the fixed current signal from the fixed current source 206, 456 increases rapidly, approximating a step function.

Figure 9A:
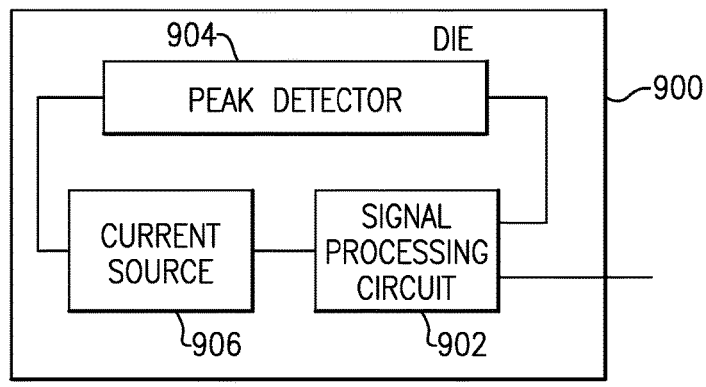
FIG. 9A is an exemplary block diagram of a multimode signal processing semiconductor die including an embodiment of a peak detector, a current source, and a signal processing circuit, according to certain embodiments.

FIG. 9A is an exemplary block diagram of a multimode signal processing semiconductor die 900 including a signal processing circuit 902, a peak detector 904, and a current source 906. In one embodiment, the current source 906 comprises the variable current source 106, 406. In another embodiment, the current source 906 comprises the fixed current source 206, 456 and/or the switch 205, 455. In an embodiment, the die 900 comprises a silicon (Si) die. In another embodiment, the die 900 can comprise a gallium arsenide (GaAs) die, a pseudomorphic high electron mobility transistor (pHEMT) die, or the like.

Figure 9B:
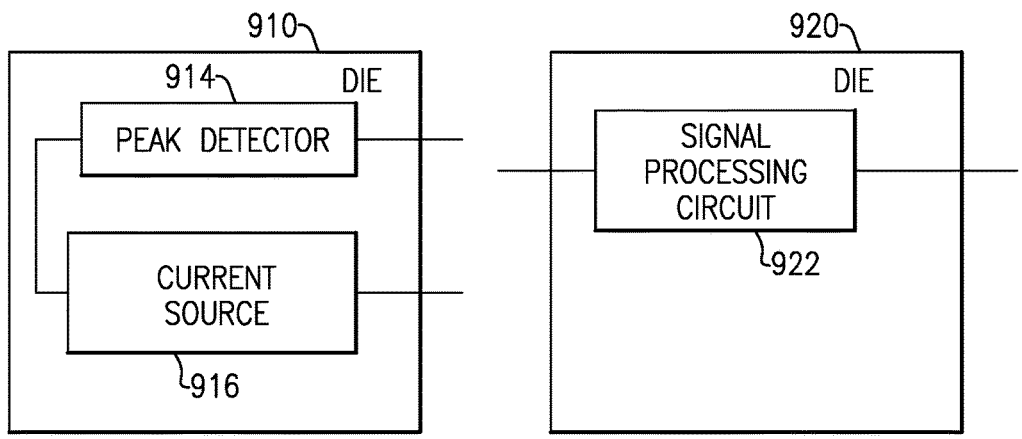
FIG. 9B is an exemplary block diagram of a bias controller set having a first semiconductor die including an embodiment of a peak detector and a current source, and a second semiconductor die including an embodiment of a signal processing circuit, according to certain embodiments.

FIG. 9B is an exemplary block diagram of a bias controller set having a first semiconductor die 910 including a peak detector 914 and a current source 916, and a second semiconductor die 920 including a signal processing circuit 922. In one embodiment, the current source 916 comprises the variable current source 106, 406. In another embodiment, the current source 916 comprises the fixed current source 206, 456 and/or the switch 105, 455. In an embodiment, the die 910 comprises a silicon (Si) die and the die 920 comprises a gallium arsenide (GaAs) die. In another embodiment, the die 910 and/or the die 920 can comprise a Si die, a GaAs die, a pHEMT die, or the like.

Figure 10A:
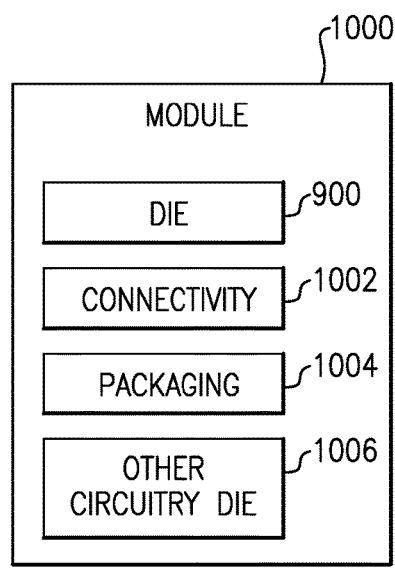
FIG. 10A is an exemplary block diagram of a multimode signal processing module including the multimode signal processing semiconductor die of FIG. 9A, according to certain embodiments.

FIG. 10A is an exemplary block diagram of a multimode signal processing module 1000 including the multimode signal processing semiconductor die 900 of FIG. 9A. The module 1000 further includes connectivity 1002 to provide signal interconnections, packaging 1004, such as for example, a package substrate, for packaging of the circuitry, and other circuitry die 1006, such as, for example amplifiers, pre-filters, post filters modulators, demodulators, down converters, and the like, as would be known to one of skill in the art of semiconductor fabrication in view of the disclosure herein.

Figure 10B:
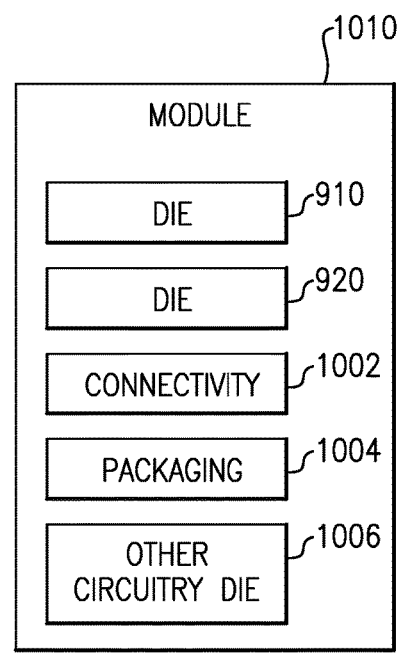
FIG. 10B is an exemplary block diagram of a bias controller module including the first and second semiconductor die of FIG. 9B, according to certain embodiments.

FIG. 10B is an exemplary block diagram of a bias controller module 1010 including the first semiconductor die 910 and the second semiconductor die 920 of FIG. 9B. The module 1010 further includes the connectivity 1002, the packaging 1004, and other circuitry die 1006, as described above.

Figure 11:
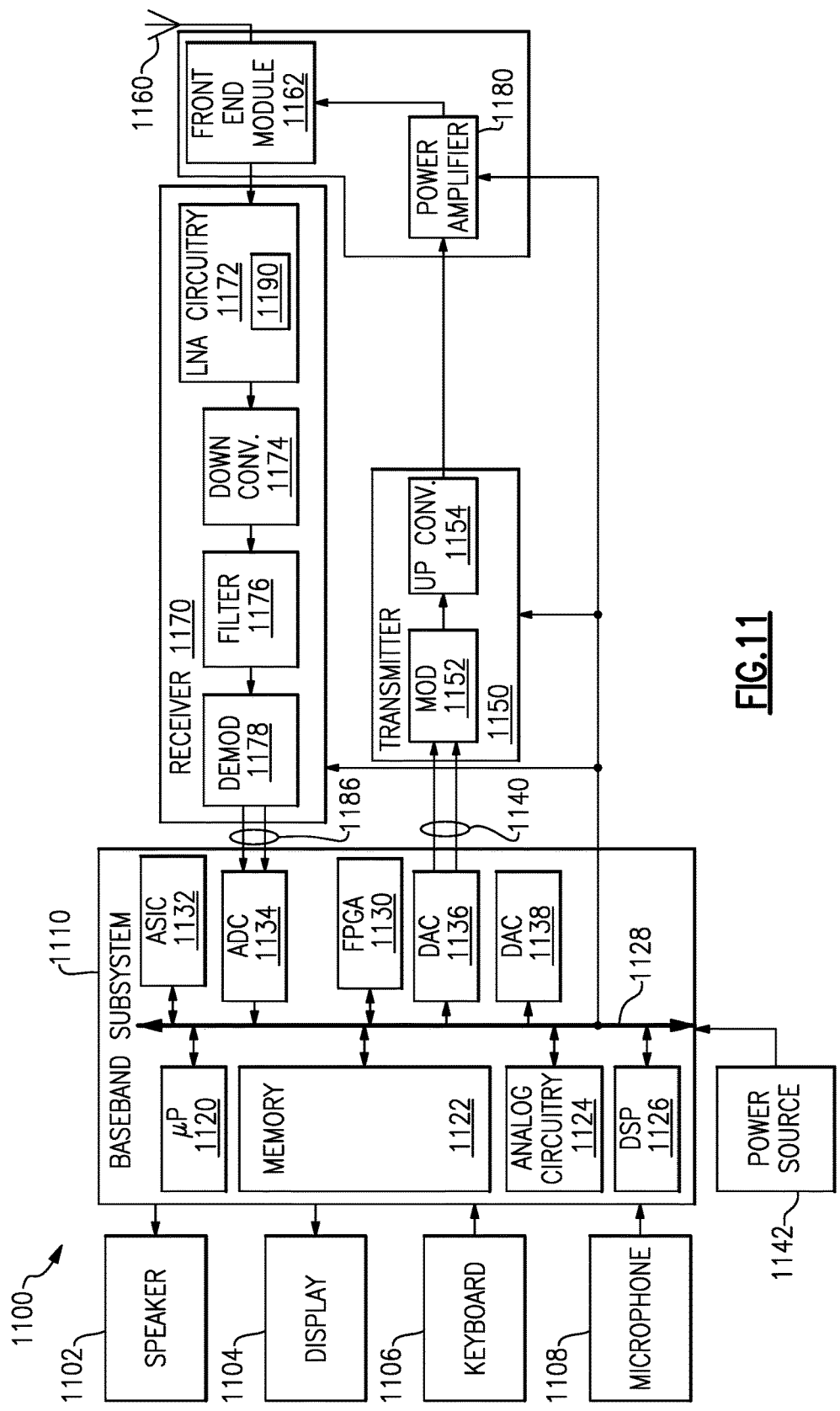
FIG. 11 is an exemplary block diagram illustrating a simplified portable transceiver including an embodiment of a circuit and method for DC biasing a signal processing circuit, according to certain embodiments.

FIG. 11 is an exemplary block diagram illustrating a simplified portable transceiver 1100 including an embodiment of the circuit 100, 120, 140, 200, 230, 240, 400, 450 or 500 for DC biasing a signal processing circuit, such as, for example, a low noise amplifier. The portable transceiver 1100 includes a speaker 1102, a display 1104, a keyboard 1106, and a microphone 1108, all connected to a baseband subsystem 1110. A power source 1142, which may be a direct current (DC) battery or other power source, is also connected to the baseband subsystem 1110 to provide power to the portable transceiver 1100. In a particular embodiment, portable transceiver 1100 can be, for example but not limited to, a portable telecommunication device such as a mobile cellular-type telephone. The speaker 1102 and the display 1104 receive signals from baseband subsystem 1110, as known to those skilled in the art. Similarly, the keyboard 1106 and the microphone 1108 supply signals to the baseband subsystem 1110. The baseband subsystem 1110 includes a microprocessor (uP) 1120, memory 1122, analog circuitry 1124, and a digital signal processor (DSP) 1126 in communication via bus 1128. Bus 1128, although shown as a single bus, may be implemented using multiple busses connected as necessary among the subsystems within the baseband subsystem 1110. The baseband subsystem 1110 may also include one or more of an application specific integrated circuit (ASIC) 1132 and a field programmable gate array (FPGA) 1130.

The microprocessor 1120 and memory 1122 provide the signal timing, processing, and storage functions for portable transceiver 1100. The analog circuitry 1124 provides the analog processing functions for the signals within baseband subsystem 1110. The baseband subsystem 1110 provides control signals to a transmitter 1150, a receiver 1170, and a power amplifier 1180, for example.

It should be noted that, for simplicity, only the basic components of the portable transceiver 1100 are illustrated herein. The control signals provided by the baseband subsystem 1110 control the various components within the portable transceiver 1100. Further, the function of the transmitter 1150 and the receiver 1170 may be integrated into a transceiver.

The baseband subsystem 1110 also includes an analog-to-digital converter (ADC) 1134 and digital-to-analog converters (DACs) 1136 and 1138. In this example, the DAC 1136 generates in-phase (I) and quadrature-phase (Q) signals 1140 that are applied to a modulator 1152. The ADC 1134, the DAC 1136 and the DAC 1138 also communicate with the microprocessor 1120, the memory 1122, the analog circuitry 1124 and the DSP 1126 via bus 1128. The DAC 1136 converts the digital communication information within baseband subsystem 1110 into an analog signal for transmission to the modulator 1152 via connection 1140. Connection 1140, while shown as two directed arrows, includes the information that is to be transmitted by the transmitter 1150 after conversion from the digital domain to the analog domain.

The transmitter 1150 includes the modulator 1152, which modulates the analog information on connection 1140 and provides a modulated signal to upconverter 1154. The upconverter 1154 transforms the modulated signal to an appropriate transmit frequency and provides the upconverted signal to the power amplifier 1180. The power amplifier 1180 amplifies the signal to an appropriate power level for the system in which the portable transceiver 1100 is designed to operate.

Details of the modulator 1152 and the upconverter 1154 have been omitted, as they will be understood by those skilled in the art. For example, the data on connection 1140 is generally formatted by the baseband subsystem 1110 into in-phase (I) and quadrature (Q) components. The I and Q components may take different forms and be formatted differently depending upon the communication standard being employed.

The power amplifier 1180 supplies the amplified signal to a front end module 1162. The front end module 1162 comprises an antenna system interface that may include, for example, a diplexer having a filter pair that allows simultaneous passage of both transmit signals and receive signals, as known to those having ordinary skill in the art. The transmit signal is supplied from the front end module 1162 to the antenna 1160.

A signal received by antenna 1160 will be directed from the front end module 1162 to the receiver 1170. The receiver 1170 includes low noise amplifier circuitry 1172 including an embodiment of the circuit 100, 120, 140, 200, 230, 240, 400, 450, or 500 for DC biasing a low noise amplifier, a downconverter 1174, a filter 1176, and a demodulator 1178.

In an embodiment, the low noise amplifier circuitry 1172 comprises the module 1190. In an embodiment module 1190 comprises multimode processing module 1000 including the multimode processing die 900. In another embodiment, the module 1190 comprises the bias controller module 1010 including the bias controller die 910 and the signal processing die 920. In these embodiments, the signal processing circuit in the die 900, 920 is a low noise amplifier.

In a further embodiment, the receiver module 1170 comprises the multimode processing die 900. In yet another embodiment, the receiver module 1170 comprises the bias controller die 910 and the signal processing die 920. In these embodiments, the signal processing circuit in the die 900, 920 is a low noise amplifier.

The low noise amplifier circuitry 1172 amplifies the received signal. Further, in an embodiment, the low noise amplifier circuitry 1172 biases one or more low noise amplifiers using the peak detector and variable current source, as described herein, to improve the linearity of the one or more low noise amplifiers. In another embodiment, the low noise amplifier circuitry 1172 biases one or more low noise amplifiers using the peak detector, the switch, and the fixed current source, as described herein, to improve linearity of the one or more low noise amplifiers.

If implemented using a direct conversion receiver (DCR), the downconverter 1174 converts the amplified received signal from an RF level to a baseband level (DC), or a near-baseband level (approximately 100 kHz). Alternatively, the amplified received RF signal may be downconverted to an intermediate frequency (IF) signal, depending on the application. The downconverted signal is sent to the filter 1176. The filter 1176 comprises a least one filter stage to filter the received downconverted signal as known in the art.

The filtered signal is sent from the filter 1176 to the demodulator 1178. The demodulator 1178 recovers the transmitted analog information and supplies a signal representing this information via connection 1186 to the ADC 1134. The ADC 1134 converts these analog signals to a digital signal at baseband frequency and transfers the signal via bus 1128 to the DSP 1126 for further processing.

While embodiments have been described with respect to a low noise amplifier, the disclosed systems and methods apply to any signal processing circuit, such as, for example, a mixer, an IF amplifier, a variable gain amplifier, and the like, as would be known to one of skill in the art in view of the disclosure herein.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of certain embodiments is not intended to be exhaustive or to limit the invention to the precise form disclosed above. While specific embodiments of, and examples for, the invention are described above for illustrative purposes, various equivalent modifications are possible within the scope of the invention, as those ordinary skilled in the relevant art will recognize in view of the disclosure herein.

For example, the peak detector may be implemented to detect a signal less than the threshold, equal to the threshold or greater than the threshold. In embodiments with more than one current source, the current sources may be variable current sources, fixed current sources, or a combination of variable and mixed current sources.

For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A circuit assembly comprising:
first and second signal processing circuits, each of the first and second signal processing circuits including a biasing circuit and a biasing current source configured to provide a biasing current to the biasing circuit, each of the first and second signal processing circuits configured to receive a radio frequency input signal and to generate an output signal, a radio frequency output signal including the output signal of the first and second signal processing circuits;
a threshold detector configured to monitor the radio frequency output signal, to generate a first control signal that is approximately proportional to the radio frequency output signal, to detect a plurality of thresholds in the radio frequency output signal, and to generate a second control signal responsive to the plurality of thresholds;
first and second current sources respectively configured to provide additional current to the biasing circuits of the first and second signal processing circuits, the first current source configured to be enabled by the first control signal when a first threshold in the radio frequency output signal is detected; and
a switch separate from the second current source and in communication with the second current source and the threshold detector, the switch configured to be closed by the second control signal when a second threshold in the radio frequency output signal is detected, the second current source configured to be enabled by the first control signal to provide the additional current to the biasing circuit of the second signal processing circuit and to be electrically connected in parallel with the first current source when the switch is closed.

2. The circuit assembly of claim 1 wherein the first and second signal processing circuits are low noise amplifier circuits.

3. The circuit assembly of claim 1 wherein the second threshold is greater than the first threshold.

4. The circuit assembly of claim 1 further comprising a bias controller.

5. The circuit assembly of claim 4 implemented in a semiconductor die.

6. The circuit assembly of claim 1 implemented in a wireless device.

7. A method of improving linearity by biasing a circuit assembly including first and second signal processing circuits, the method comprising:
receiving a radio frequency input signal at an input of the first signal processing circuit;
generating a radio frequency output signal of the circuit assembly based on an output from the first signal processing circuit and an output from the second signal processing circuit;
enabling a first bias current source to provide first biasing current to a first bias circuit of the first signal processing circuit;
detecting a plurality of thresholds based on an output from the first signal processing circuit,
generating a first control signal that is approximately proportional to the radio frequency output signal of the circuit assembly and a second control signal responsive to the plurality of thresholds;
enabling, with the first control signal, a first additional current source of the first signal processing circuit to provide additional biasing current to the first bias circuit when a first threshold in the radio frequency output signal is detected;
closing a switch, with the second control signal, when a second threshold is detected, the second bias current source configured to be electrically connected in parallel with the first bias current source when the switch is closed; and
enabling, with the first control signal, the second bias current source when the switch is closed to provide second biasing current to the second signal processing circuit, the second biasing current being approximately proportional to the radio frequency output signal, the switch separate from the first and second current sources.

8. The method of claim 7 wherein the first and second signal processing circuits are low noise amplifier circuits.

9. The method of claim 7 wherein the parallel connection of the first bias current source and the second bias current source is implemented so that the radio frequency output signal is maintained in an acceptable linear operating region when a larger radio frequency input signal is processed.

10. The method of claim 7 wherein the second threshold is greater than the first threshold.

11. The method of claim 7 further comprising decreasing the first biasing current from the first biasing current source of the first signal processing circuit when a detected signal in the radio frequency output signal is less than the first threshold.

12. The method of claim 7 wherein the additional current from the first additional current source of the first signal processing circuit is approximately proportional to the radio frequency output signal.

13. A wireless device comprising:
an antenna implemented to receive a radio frequency input signal; and
a receiver including (i) first and second signal processing circuits, each of the first and second signal processing circuits including a biasing circuit and a biasing current source configured to provide a biasing current to the biasing circuit, each of the first and second signal processing circuits configured to receive a radio frequency input signal and to generate an output signal, a radio frequency output signal including the output signals of the first and second signal processing circuits, (ii) a threshold detector configured to monitor the radio frequency output signal, to generate a first control signal that is approximately proportional to the radio frequency output signal, to detect a plurality of thresholds in the radio frequency output signal, and to generate a second control signal responsive to the plurality of thresholds, (iii) first and second current sources respectively configured to provide additional current to the biasing circuits of the first and second signal processing circuits, the first current source configured to be enabled by the first control signal when a first threshold in the radio frequency output signal is detected by the threshold detector, and (iv) a switch separate from the second current source and in communication with the second current source and the threshold detector, the switch configured to closed by the second control signal when a second threshold in the radio frequency output signal is detected by the threshold detector, the second current source configured to be enabled by the first control signal to provide the additional current to the biasing circuit of the second signal processing circuit and to be electrically connected in parallel with the first current source when the switch is closed.

14. The wireless device of claim 13 wherein the first and second signal processing circuits are low noise amplifier circuits.

15. The method of claim 13 wherein the parallel connection of the first current source and the second current source is implemented so that the radio frequency output signal is maintained in an acceptable linear operating region when a larger radio frequency input signal is processed.

16. The wireless device of claim 13 wherein the second threshold is greater than the first threshold.

17. The wireless device of claim 13 wherein the additional current from the additional current source of the first signal processing circuit is approximately proportional to the radio frequency output signal.

* * * * *